United States Patent
Takeuchi

(10) Patent No.: US 9,746,789 B2
(45) Date of Patent: Aug. 29, 2017

(54) EXPOSURE APPARATUS, AND METHOD OF MANUFACTURING ARTICLE

(71) Applicant: CANON KABUSHIKI KAISHA, Tokyo (JP)

(72) Inventor: Hajime Takeuchi, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 69 days.

(21) Appl. No.: 14/608,731

(22) Filed: Jan. 29, 2015

(65) Prior Publication Data

US 2015/0220004 A1    Aug. 6, 2015

(30) Foreign Application Priority Data

Feb. 4, 2014  (JP) ................. 2014-019768

(51) Int. Cl.
*G03F 9/00* (2006.01)
*G03F 7/20* (2006.01)

(52) U.S. Cl.
CPC ........ *G03F 9/7026* (2013.01); *G03F 7/70641* (2013.01)

(58) Field of Classification Search
CPC ............. G03F 9/7026; G03F 7/70641
See application file for complete search history.

(56) References Cited

U.S. PATENT DOCUMENTS

2008/0266537 A1* 10/2008 Abuku ............... G03B 27/42
355/53

FOREIGN PATENT DOCUMENTS

JP    2009-094256 A    4/2009

* cited by examiner

*Primary Examiner* — Michelle M Iacoletti
(74) *Attorney, Agent, or Firm* — Rossi, Kimms & McDowell LLP

(57) ABSTRACT

The present invention provides an exposure apparatus which performs a scanning exposure of each of a plurality of shot regions on a substrate, comprising a measuring device including a first detector configured to perform detection with respect to a measurement point on the substrate and a second detector configured to perform detection with respect to the measurement point prior to detection by the first detector, and configured to measure a height of the substrate based on an output from the first detector and an output from the second detector, and a processor configured to determine, based on measurement obtained based on an output from the first detector along with a scanning exposure of a first shot region, a first measurement point where the measuring device performs measurement first based on an output from the second detector with respect to a second shot region.

17 Claims, 7 Drawing Sheets

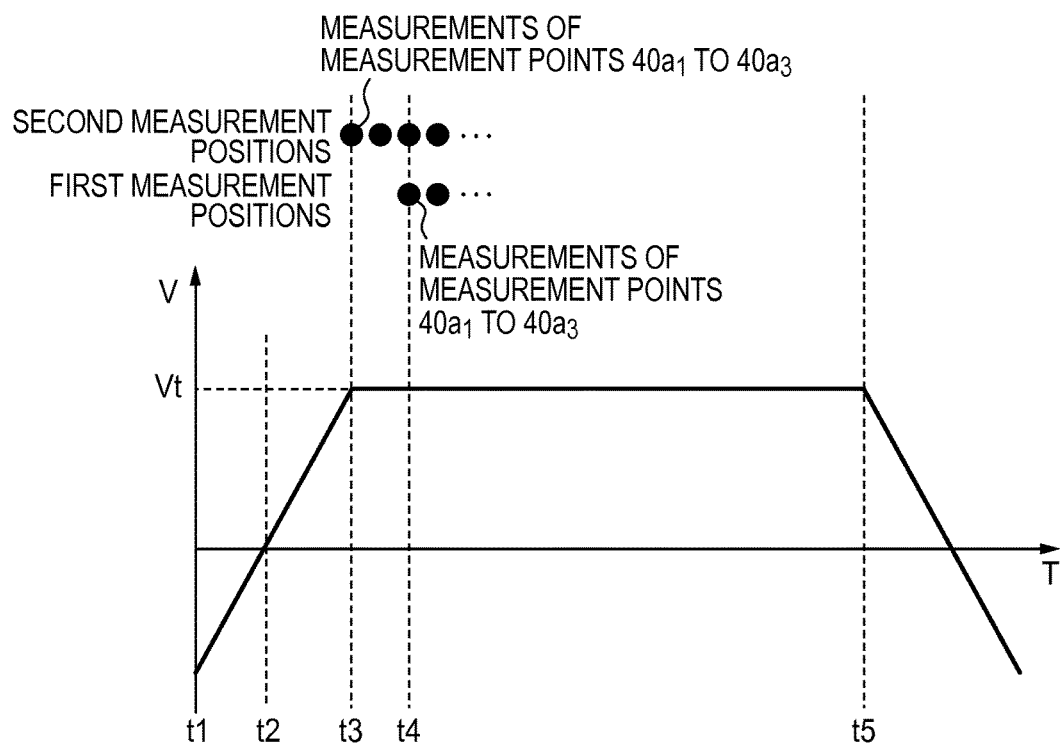
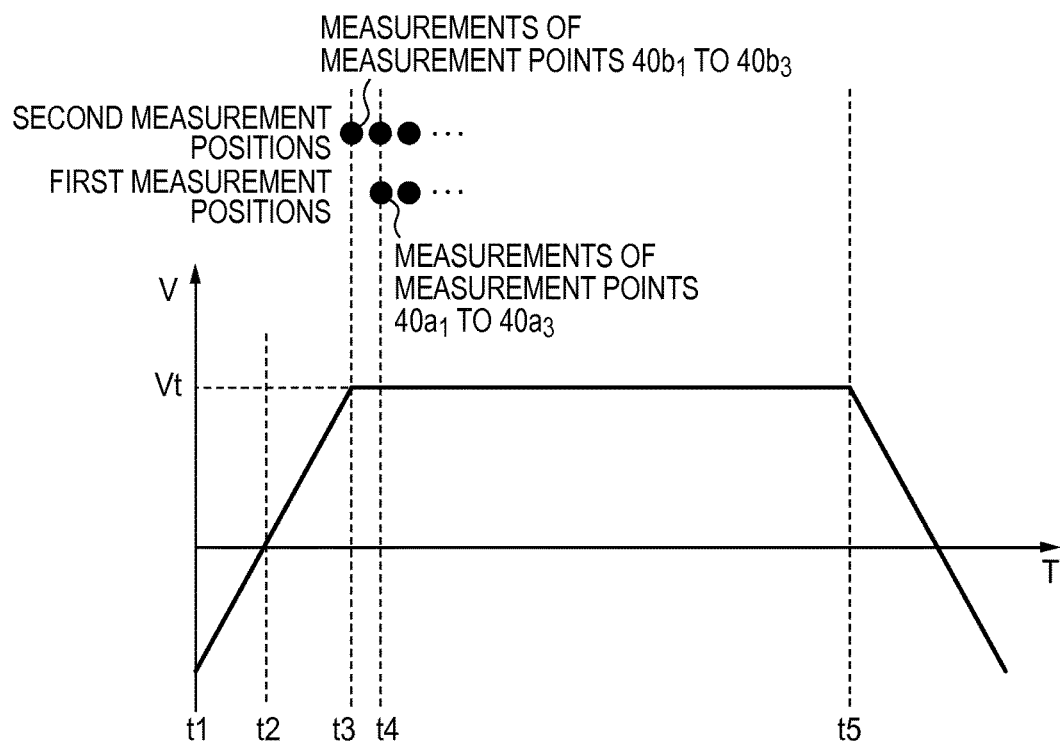

EXPOSURE APPARATUS, AND METHOD OF MANUFACTURING ARTICLE

BACKGROUND OF THE INVENTION

Field of the Invention

The present invention relates to an exposure apparatus, and a method of manufacturing an article.

Description of the Related Art

There is an exposure apparatus for performing scanning exposure to a shot region on a substrate by scanning slit-shaped light on the substrate as one of the apparatuses used in the manufacturing processes (lithography processes) of semiconductor devices and the like. Such an exposure apparatus performs measurement (focus measurement) of the surface height of the substrate prior to irradiation of the substrate with slit-shaped light, and performs scanning exposure to the shot region while arranging, based on the measurement result, the surface of the substrate on the image plane (focus plane) of a projection optical system.

In the exposure apparatus, a period (settling time) from the completion of acceleration of a stage to the start of scanning exposure may be reduced to increase a throughput. To achieve this, Japanese Patent Laid-Open No. 2009-94256 proposes a method of setting the settling time in accordance with required focus accuracy. For example, if the allowable value of defocus is large, focus measurement in the end portion or the vicinity of a shot region can be omitted. This makes it possible to shorten a period prior to the start of scanning exposure and in which a stage suitable for focus measurement is moved at a uniform velocity, and thus shorten the settling time.

Although the method of setting the settling time in accordance with the allowable value of defocus is effective, defocus may exceed the allowable value depending on the surface shape of a substrate.

SUMMARY OF THE INVENTION

The present invention provides, for example, an exposure apparatus advantageous in terms of compatibility between focus performance and throughput.

According to one aspect of the present invention, there is provided an exposure apparatus which performs a scanning exposure of each of a plurality of shot regions on a substrate to radiation, the apparatus comprising: a measuring device including a first detector configured to perform detection with respect to a measurement point on the substrate in a region being exposed to radiation along with scanning of the substrate and a second detector configured to perform detection with respect to the measurement point along with scanning of the substrate prior to detection by the first detector, and configured to measure a height of the substrate based on each of an output from the first detector and an output from the second detector; and a processor configured to determine, based on measurement obtained by the measuring device based on an output from the first detector along with a scanning exposure of a first shot region to radiation, a first measurement point where the measuring device performs measurement first based on an output from the second detector with respect to a second shot region of which a scanning exposure is performed after the first shot region.

Further features of the present invention will become apparent from the following description of exemplary embodiments with reference to the attached drawings.

BRIEF DESCRIPTION OF THE DRAWINGS

FIG. 5A is a view showing the relationship between time and the moving velocity of a substrate stage;

FIG. 5B is a view showing the relationship between the time and the moving velocity of the substrate stage;

DESCRIPTION OF THE EMBODIMENTS

Figure 1:
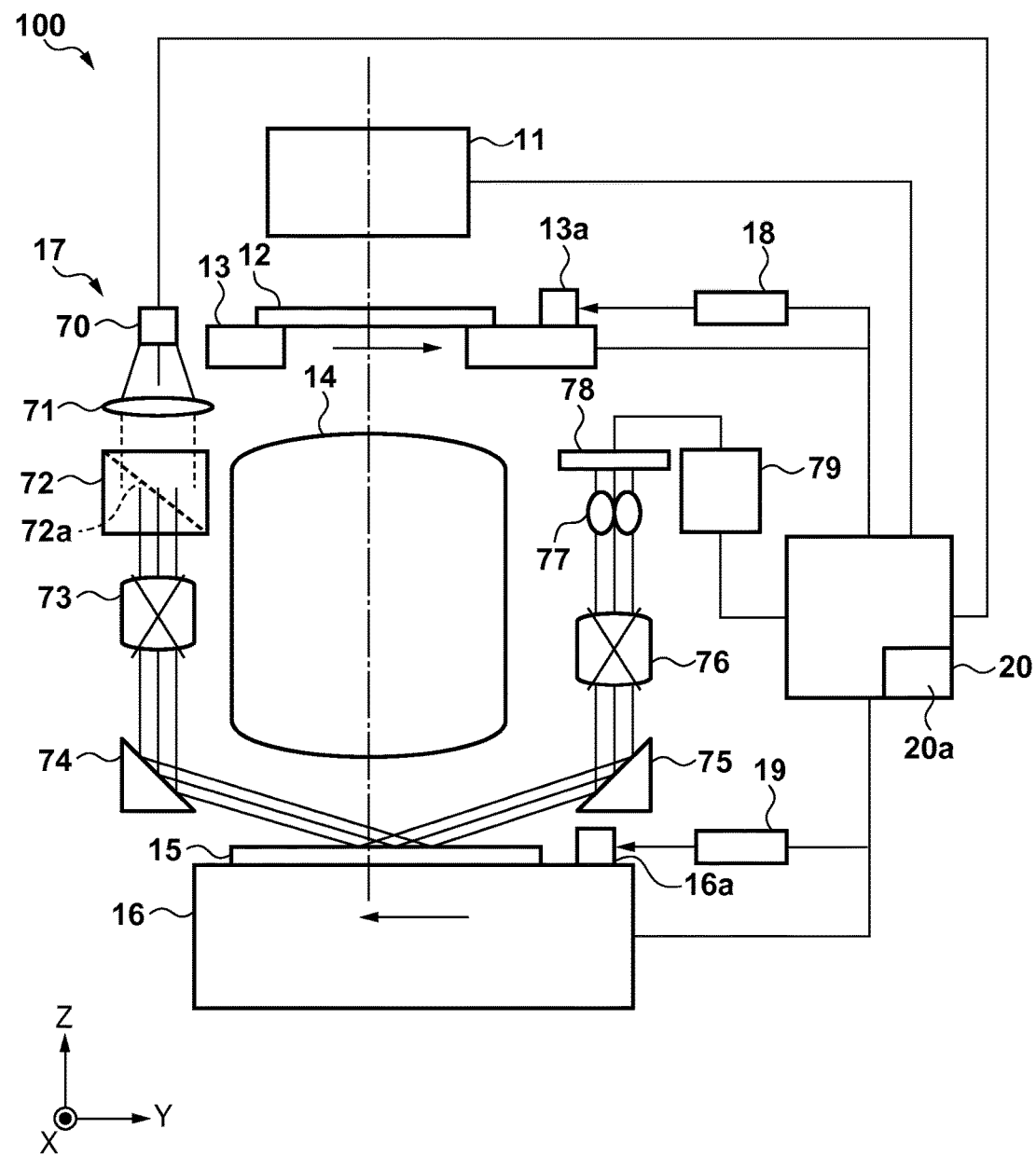
FIG. 1 is a schematic view showing the arrangement of an exposure apparatus of the first embodiment.

Exemplary embodiments of the present invention will be described below with reference to the accompanying drawings. Note that the same reference numerals denote the same members throughout the drawings, and a repetitive description thereof will not be given. In the first embodiment, an exposure apparatus which performs scanning exposure on a substrate by slit-shaped light will be explained. However, the present invention can also be applied to an exposure apparatus which performs scanning exposure on the substrate by a charged particle beam.

First Embodiment

An exposure apparatus 100 of the first embodiment of the present invention will be explained with reference to FIG. 1. FIG. 1 is a schematic view showing the arrangement of the exposure apparatus 100 of the first embodiment of the present invention. The exposure apparatus 100 of the first embodiment is a step-and-scan type scanning exposure apparatus which performs scanning exposure on a substrate 15 by using slit-shaped light. The exposure apparatus 100 can include an illumination optical system 11, a mask stage 13, a projection optical system 14, a substrate stage 16 (stage), a measuring unit 17, a first position detector 18, a second position detector 19, and a controller 20. The controller 20 includes a CPU and memory, and controls the whole (the individual units) of the exposure apparatus 100. That is, the controller 20 controls a process of transferring a pattern formed on a mask 12 onto the substrate 15 (a process of performing scanning exposure on the substrate 15). Furthermore, in the first embodiment, an explanation will be made assuming that the controller 20 includes a processor 20a which performs a process of determining the measurement start points at the second measurement positions (second measurement portions) in a shot region 15a on the substrate. However, the controller 20 and the processor 20a may be formed separately.

The illumination optical system 11 shapes light emitted from a light source (not shown) such as an excimer laser into band-like or arcuate slit-shaped light elongated in, for example, the X direction by using a light-shielding member such as a masking blade included in the system, and illuminates a portion of the mask 12 with this slit-shaped light. The mask 12 and the substrate 15 are respectively held by the mask stage 13 and the substrate stage 16, and are arranged in optically almost conjugate positions (the object plane and the image plane of the projection optical system 14) via the projection optical system 14. The projection optical system 14 has a predetermined projection magnification (for example, ×½ or ×¼), and projects the pattern formed on the mask 12 onto the substrate by using the slit-shaped light. A region of the substrate 15 on which the pattern of the mask 12 is projected (a region to be irradiated with the slit-shaped light) will be referred to as a region 21 being irradiated with radiation hereinafter. The mask stage 13 and the substrate stage 16 are so configured as to be movable in a direction (for example, the Y direction) perpendicular to the optical axis of the projection optical system 14 (the optical axis of the slit-shaped light), and are relatively scanned in synchronism with each other at a velocity ratio matching the projection magnification of the projection optical system 14. This makes it possible to scan the region 21 being irradiated with radiation on the substrate, and transfer the pattern of the mask 12 onto the shot region 15a on the substrate. This scanning exposure is sequentially repeated on each of the plurality of shot regions 15a on the substrate while performing step movement of the substrate stage 16, thereby completing an exposure process for one substrate 15.

The first position detector 18 includes, for example, a laser interferometer, and detects the position of the mask stage 13. For example, the laser interferometer included in the first position detector 18 emits a laser beam toward a reflecting plate 13a formed on the mask stage 13, and detects a displacement from a reference position on the mask stage 13 by the laser beam reflected by the reflecting plate 13a. Accordingly, the first position detector 18 can acquire the present position of the mask stage 13 based on the displacement. Also, the second position detector 19 includes, for example, a laser interferometer, and detects the position of the substrate stage 16. For example, the laser interferometer included in the second position detector 19 emits a laser beam toward a reflecting plate 16a formed on the substrate stage 16, and detects a displacement from a reference position on the substrate stage 16 by the laser beam reflected by the reflecting plate 16a. Thus, the second position detector 19 can acquire the present position of the substrate stage 16 based on the displacement. Then, based on the present positions of the mask stage 13 and the substrate stage 16 respectively acquired by the first position detector 18 and the second position detector 19, the controller 20 controls driving of the mask stage 13 and the substrate stage 16 in the XY direction. The first and the second position detectors 18 and 19 use laser interferometers when detecting the positions of the mask stage 13 and the substrate stage 16, respectively. However, the present invention is not limited to this, and it is also possible to use, for example, encoders.

The measuring unit 17 measures the height of the substrate surface in a state in which the substrate stage 16 is moving, in order to accord the surface of the substrate 15 (to be referred to as a substrate surface hereinafter) with the image plane (focus plane) of the projection optical system 14. The measuring unit 17 of the first embodiment is an oblique incidence type measuring unit which obliquely irradiates the substrate 15 with light, and includes an irradiation system 17a for irradiating the substrate 15 with light, and a light-receiving system 17b for receiving light reflected by the substrate 15.

Figure 2:
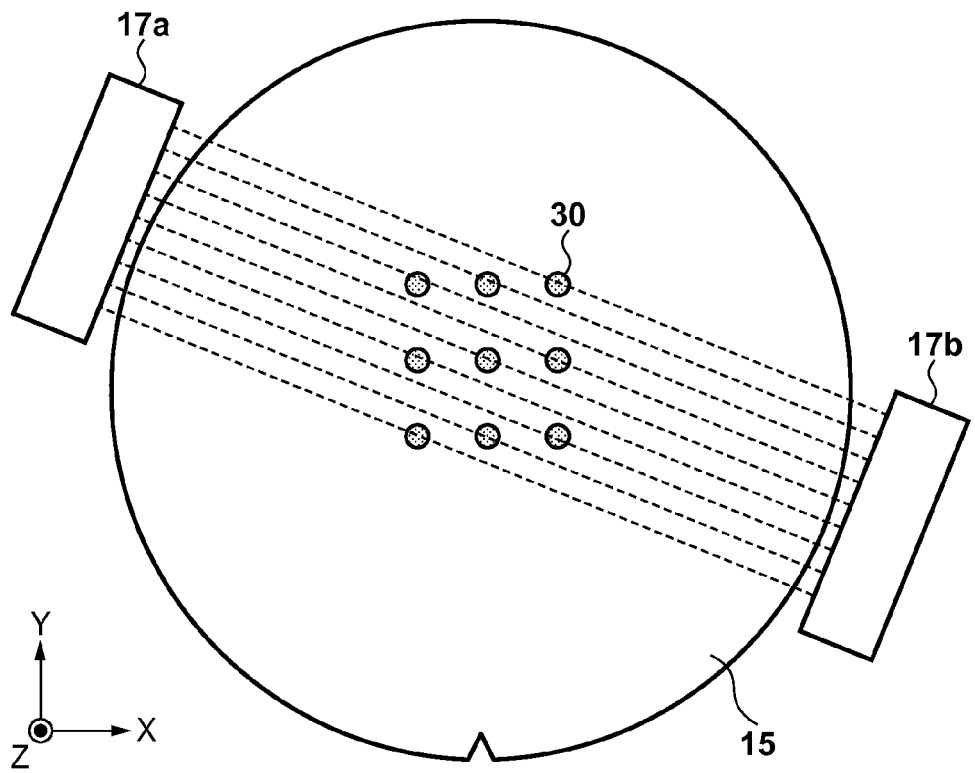
FIG. 2 is a view showing the layout of a plurality of measurement positions in a measuring unit.

The irradiation system 17a can include, for example, a light source 70, a collimator lens 71, a slit member 72, an optical system 73, and a mirror 74. The light source 70 is formed by using, for example, a lamp or a light-emitting diode, and emits light having a wavelength to which a resist on the substrate is not sensitive. The collimator lens 71 collimates the light emitted from the light source 70 into parallel light having an almost uniform light intensity distribution in the section. The slit member 72 is formed by a pair of prisms bonded to each other such that their oblique surfaces oppose each other. A light-shielding film such as a chromium film having a plurality of openings (for example, nine pinholes) is formed on a bonding surface 72a. The optical system 73 is a both side telecentric optical system (an optical system telecentric at both of an object side and an image side with respect thereto), and allows nine light beams passing through the plurality of openings in the slit member 72 to enter the substrate via the mirror 74. The optical system 73 is so configured that the surface 72a having the openings and a surface including the substrate surface satisfy the Scheimpflug's condition. In this embodiment, the mirror 74 is formed such that an angle $\phi$ at which each light beam emitted from the irradiation system 17a enters the substrate 15 (that is, an angle between the light beam and the optical axis of the projection optical system 14) is, for example, 70° or more. Also, as shown in FIG. 2, the irradiation system 17a is so configured as to allow the nine light beams to enter the substrate 15 at an angle $\theta$ (for example, 22.5°) with respect to the scanning direction (Y direction) of the slit-shaped light, in the direction (XY direction) parallel to the substrate surface. By thus causing the nine light beams to enter the substrate 15, it is possible to individually measure the height of the substrate surface in nine measurement positions 30.

The light-receiving system 17b can include, for example, a mirror 75, a light-receiving optical system 76, a correction optical system 77, a photoelectric conversion section 78, and a processor 79. The mirror 75 guides the nine light beams reflected by the substrate 15 to the light-receiving optical system 76. The light-receiving optical system 76 is a both side telecentric operation system (an optical system telecentric at both of an object side and an image side with respect thereto), and includes a stop formed in common to the nine light beams. This stop included in the light-receiving optical system 76 blocks high-order diffracted light (noise light) generated due to the circuit pattern formed on the substrate. The correction optical system 77 includes a plurality of (nine) lenses corresponding to the nine light beams, and forms images of the nine light beams on the light-receiving surface of the photoelectric conversion section 78, thereby forming pinhole images on the light-receiving surface. The photoelectric conversion section 78 includes a plurality of (nine) photoelectric conversion devices corresponding to the nine light beams. As each photoelectric conversion devices, it is possible to use, for example, a CCD line sensor. The processor 79 calculates the height of the substrate surface at each measurement position 30 based on the positional change of each pinhole on the light-receiving surface of the photoelectric conversion section 78.

By thus configuring the irradiation system 17a and light-receiving system 17b, the measuring unit 17 can measure the height of the substrate surface in each measurement position 30 based on the positional change of each pinhole image on the light-receiving surface of the photoelectric conversion section 78. Then, the controller 20 controls driving of the substrate stage 16 based on the measurement results obtained by the measuring unit 17, so that the substrate surface is arranged at the target height (focusing plane (target value)). The light-receiving system 17b performs tilt correction such that each measurement position 30 on the substrate and the light-receiving surface of the photoelectric conversion section 78 become conjugate with each other. Accordingly, the position of each pinhole image on the light-receiving surface of the photoelectric conversion section 78 does not change due to a local inclination at each measurement position 30.

Figure 3:
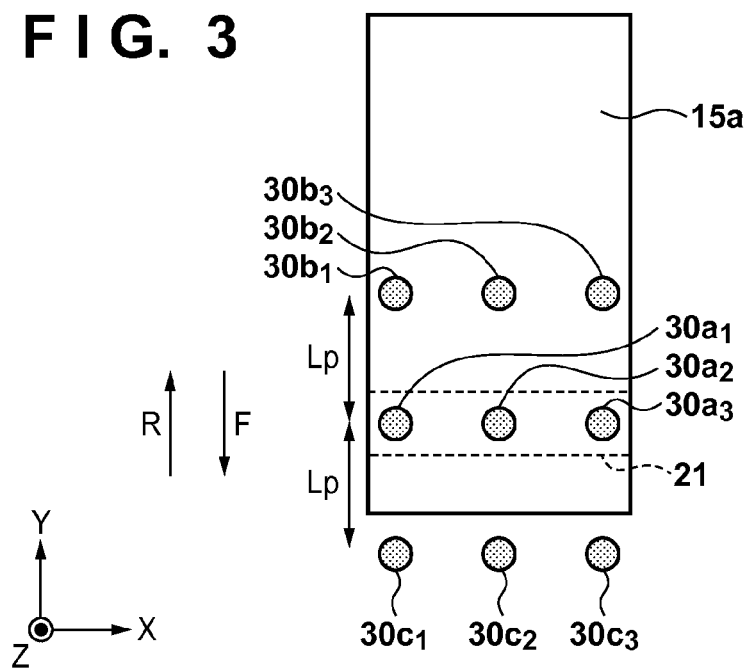
FIG. 3 is a view showing the positional relationship between the plurality of measurement positions in the measuring unit and a region being irradiated with radiation to be irradiated with slit-shaped light.

FIG. 3 is a view showing the positional relationship between the plurality of measurement positions 30 in the measuring unit 17 and the region 21 being irradiated with radiation to be irradiated with the slit-shaped light. The measuring unit 17 can include a first detector which performs detection with respect to a measurement point on the substrate inside the region 21 being irradiated with radiation (within a region being exposed to radiation) along with scanning on the substrate 15, and a second detector which performs detection with respect to the measurement point on the substrate along with scanning on the substrate 15 prior to detection by the first detector. Then, the measuring unit 17 can measure the height of the substrate 15 based on the respective outputs from the first detector and the second detector.

FIG. 3 is a view showing the positional relationship between the region 21 being irradiated with radiation and the nine measurement positions 30 to be formed in the shot region 15a on the substrate by the measuring unit 17. Referring to FIG. 3, the region 21 being irradiated with radiation is a rectangular region enclosed within broken lines. Measurement positions $30a_1$ to $30a_3$ are measurement positions 30 (first measurement positions) formed inside the region 21 being irradiated with radiation (within the region being exposed to radiation). At the first measurement positions, the first detector detects the measurement point on the substrate. Also, measurement positions $30b_1$ to $30b_3$ and $30c_1$ to $30c_3$ are measurement positions (second measurement positions) formed in positions spaced apart by a distance Lp in the scanning direction (±Y direction) of the slit-shaped light from the measurement positions $30a_1$ to $30a_3$ formed inside the region 21 being irradiated with radiation. At the second measurement positions, the second detector detects the measurement point on the substrate. The measurement positions $30b_1$ to $30b_3$ and $30c_1$ to $30c_3$ are used to measure the height of the substrate surface prior to measurements at the measurement positions $30a_1$ to $30a_3$, and are switched in accordance with the slit-shaped light scanning direction, that is, the moving direction of the substrate stage 16.

For example, when performing scanning exposure by moving the substrate stage 16 in the direction of an arrow F, the heights of a plurality of measurement points of the substrate surface are measured at the measurement positions $30b_1$ to $30b_3$ prior to measurements at the measurement positions $30a_1$ to $30a_3$ formed inside the region 21 being irradiated with radiation. Based on the measurement results at the measurement positions $30b_1$ to $30b_3$, the controller 20 controls Z-direction driving of the substrate stage 16 so that the plurality of measurement points are arranged at the target height until they reach the region 21 being irradiated with radiation. On the other hand, when performing scanning exposure by moving the substrate stage 16 in the direction of an arrow R, the heights of a plurality of measurement points of the substrate surface are measured at the measurement positions $30c_1$ to $30c_3$ prior to measurements at the measurement positions $30a_1$ to $30a_3$. Based on the measurement results at the measurement positions $30c_1$ to $30c_3$, the controller 20 controls Z-direction driving of the substrate stage 16 so that the plurality of measurement points are arranged at the target height until they reach the region 21 being irradiated with radiation.

Figure 4:
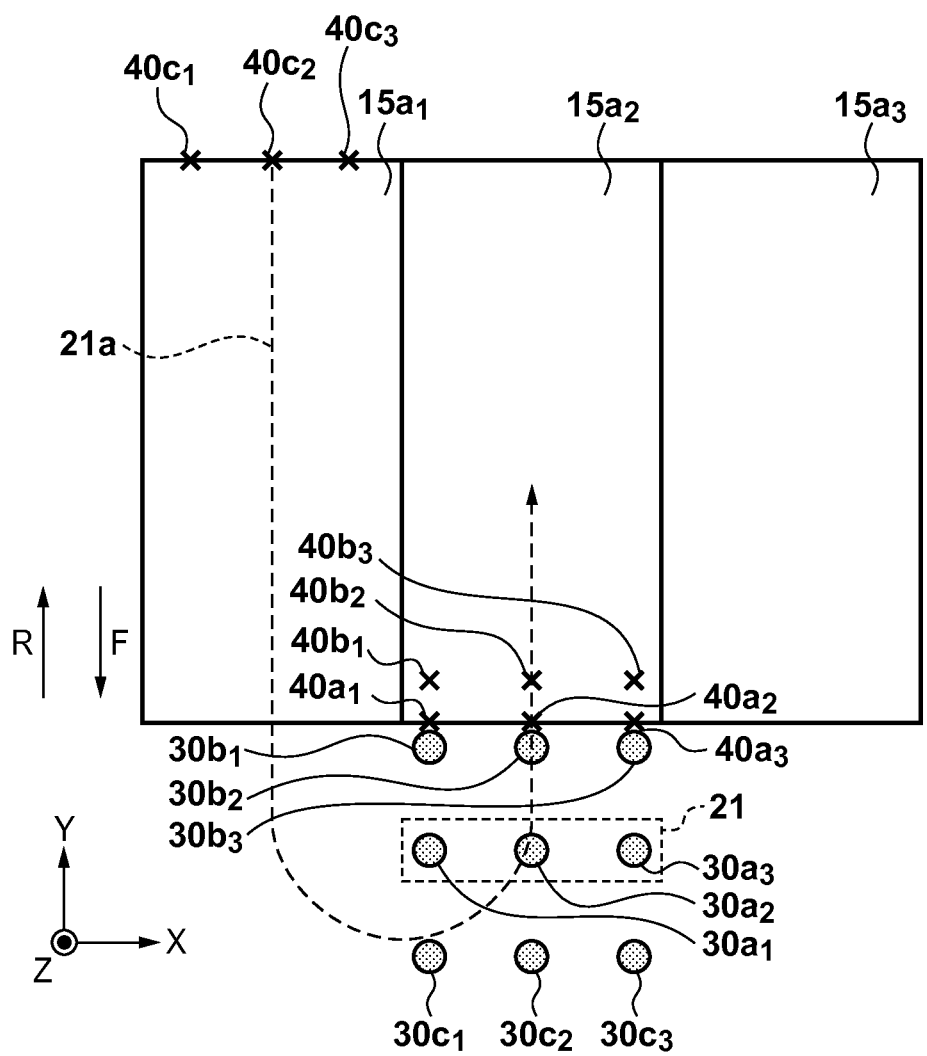
FIG. 4 is a view for explaining a method of measuring the height of a substrate by the measuring unit while scanning exposure is performed.

Next, a method of measuring the height of the substrate surface by the measuring unit 17 while performing scanning exposure will be explained with reference to FIGS. 4 and 5A. FIG. 4 is a view showing the positions of the plurality of measurement positions 30 in a case where scanning exposure is performed in the plurality of shot regions 15a formed on the substrate and a scanning path 21a of the slit-shaped light (region 21 being irradiated with radiation). FIG. 4 shows an exposed shot region $15a_1$, a shot region $15a_2$ to be exposed next to the shot region $15a_1$, and a shot region $15a_3$ to be exposed next to the shot region $15a_2$. Exposure of the shot region $15a_2$ will be explained below. FIG. 5A is a view showing the relationship between time and the moving velocity of the substrate stage 16 in the Y direction when scanning the slit-shaped light along the scanning path 21a shown in FIG. 4. In FIG. 5A, black circles (●) indicate the measurement timings at the measurement positions $30a_1$ to $30a_3$ (first measurement positions), and the measurement timings at the measurement positions $30b_1$ to $30b_3$ (second measurement positions), respectively. The scanning path 21a of the slit-shaped light (region 21 being irradiated with radiation) is shown in FIG. 4. In practice, however, the movement path (path) of the substrate stage 16 is determined so that the slit-shaped light is scanned on the substrate along the scanning path 21a. The scanning path of the slit-shaped light will be explained below for the descriptive simplicity. However, determining the scanning path of the slit-shaped light is equivalent to determining the movement path of the substrate stage 16.

First, after exposure of the shot region $15a_1$ is complete, that is, after the region 21 being irradiated with radiation comes out from shot region $15a_1$, the controller 20 decelerates the substrate stage 16 in the −Y direction, stops it, and accelerates it in the +Y direction (the direction of the arrow F). Referring to FIG. 5A, a period from time t1 to time t2 is equivalent to the period during which the substrate stage 16 is decelerated, and an interval from time t2 to time t3 is equivalent to the interval during which the substrate stage 16 is accelerated. Then, at time t3, the controller 20 controls driving of the substrate stage 16 so that the velocity of the substrate stage 16 in the Y direction reaches the target velocity, and starts measurements at the measurement positions $30b_1$ to $30b_3$. An interval from time t3 to time t4 is an interval from the time when measurements at measurement positions $30b_1$ to $30b_3$ start to the time when the region 21 being irradiated with radiation approaches the shot region $15a_2$. This interval will be referred to as a focus starting period hereinafter. In the focus starting period, the shot region $15a_2$ does not undergo scanning exposure by the slit-shaped light, but a plurality of measurement points 40 arranged in the shot region $15a_2$ are measured at the measurement positions $30b_1$ to $30b_3$ while moving the substrate stage 16 at a uniform velocity.

Figure 6:
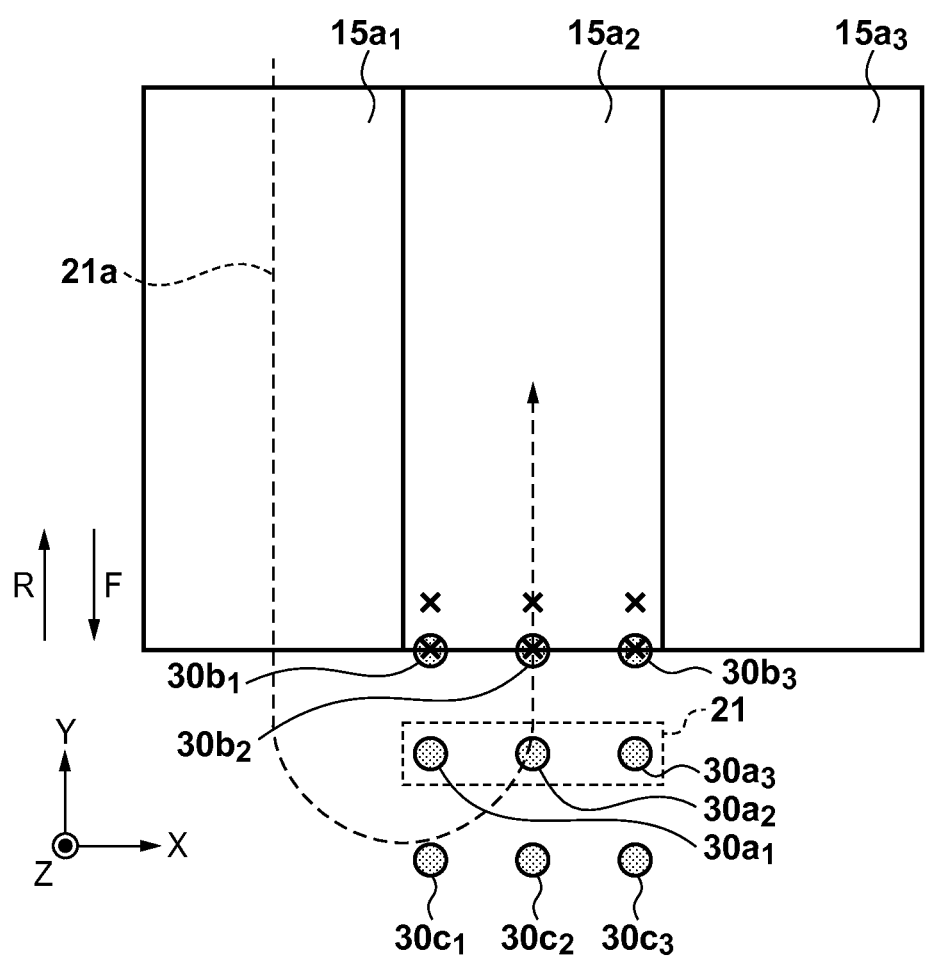
FIG. 6 is a view for explaining the method of measuring the height of the substrate by the measuring unit while performing scanning exposure.

Subsequently, the controller 20 performs scanning exposure to the shot region $15a_2$ while driving the substrate stage 16 at a uniform velocity. In FIG. 5A, this is equivalent to an interval from time t4 to time t5. Based on the heights of measurement points 40 on the shot region $15a_2$ measured at the measurement positions $30b_1$ to $30b_3$, the controller 20 controls driving of the substrate stage 16 such that the substrate surface in the region 21 being irradiated with radiation is arranged at the target height. For example, as shown in FIG. 6, when the measurement positions $30b_1$ to $30b_3$ are arranged in measurement points $40a_1$ to $40a_3$ on the shot region $15a_2$, the controller 20 causes the measuring unit 17 to measure the heights of the measurement points $40a_1$ to $40a_3$ at the measurement positions $30b_1$ to $30b_3$. Based on the measurement results at the measurement points $40a_1$ to $40a_3$, the controller 20 determines a command value for driving the substrate stage 16 so that the measurement points $40a_1$ to $40a_3$ are arranged at the target height. Then, the controller 20 drives the substrate stage 16 in accordance with the determined command value before the measurement points $40a_1$ to $40a_3$ are arranged in the region 21 being irradiated with radiation. Also, when the measurement positions $30b_1$ to $30b_3$ are arranged at measurement points $40b_1$ to $40b_3$ on the shot region $15a_2$, the controller 20 causes the measuring unit 17 to measure the heights of the measurement points $40b_1$ to $40b_3$ at the measurement positions $30b_1$ to $30b_3$. Based on the measurement results at the measurement points $40b_1$ to $40b_3$, the controller 20 determines a command value for driving the substrate stage 16 so that the measurement points $40b_1$ to $40b_3$ are arranged at the target height. Then, the controller 20 drives the substrate stage 16 in accordance with the determined command value before the measurement points $40b_1$ to $40b_3$ are arranged in the region 21 being irradiated with radiation.

In the exposure apparatus, in general, a period (focus starting period) from the start of focus measurement prior to slit-shaped light irradiation to the start of scanning exposure may be reduced to increase a throughput. That is, the interval from time t3 to time t4 in FIG. 5A may be reduced (changed). To achieve this, the processor 20a determines measurement start points (first measurement points) at the second measurement positions in the second shot region as targets of scanning exposure based on measurement results at the first measurement positions in the first shot region where scanning exposure has been performed earlier than to the second shot region. The measurement start points (first measurement points) at the second measurement positions are points where measurements at the second measurement positions are performed first. The first measurement positions are, as described above, the measurement positions 30 in the measuring unit 17 arranged to perform measurement in the region 21 being irradiated with radiation which is irradiated with the slit-shaped light, and correspond to the measurement positions $30a_1$ to $30a_3$ in the first embodiment. On the other hand, the second measurement positions are, as described above, the measurement positions 30 where measurement of the height of the substrate surface is performed before the first measurement positions, and correspond to the measurement positions $30b_1$ to $30b_3$ or the measurement positions $30C_1$ to $30C_3$ in the first embodiment. The processor 20a may preset a plurality of measurement points for the respective shot regions on the substrate and determine, out of the plurality of measurement points, the first measurement point for each shot region. Also, the processor 20a may apply the first measurement point determined in one shot region out of a plurality of shot regions to another shot region.

In an example shown in FIG. 4, measurement start points at the measurement positions $30b_1$ to $30b_3$ in the shot region $15a_2$ serving as the second shot region are determined based on the measurement results at the measurement positions $30a_1$ to $30a_3$ in the shot region $15a_1$ serving as the first shot region. The first shot region is not limited to the shot region $15a_1$ where scanning exposure has been performed immediately before scanning exposure to the shot region $15a_2$ serving as the second shot region. The first shot region can be, for example, the shot region $15a$ where scanning exposure has been performed before scanning exposure to the second shot region. Furthermore, the first shot region and the second shot region may be formed on the same substrate 15 or the different substrates 15. When the first shot region and the second shot region are formed in the different substrates 15, the first shot region and the second shot region may be formed at identical positions on the different substrates.

Figure 7:
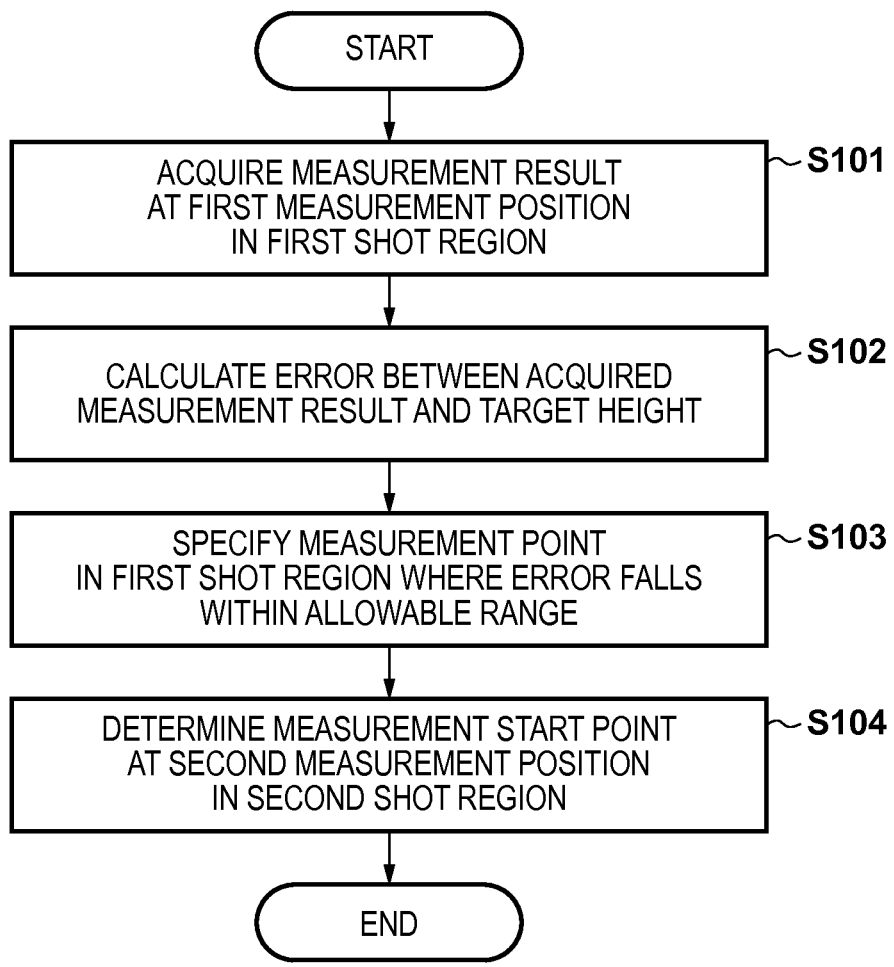
FIG. 7 is a flowchart showing a method of determining the measurement start points at the second measurement positions in the first shot region.

A method of determining, by the processor 20a, the measurement start points at the second measurement positions (measurement positions $30b_1$ to $30b_3$) in the second shot region (the shot region $15a_2$ in FIG. 4) will be explained below with reference to FIG. 7. FIG. 7 is a flowchart showing the method of determining the measurement start points at the second measurement positions in the second shot region. In step S101, the processor 20a acquires a measurement result obtained by measuring the plurality of measurement points 40 provided in the first shot region at the first measurement positions (measurement positions $30a_1$ to $30a_3$). In step S102, the processor 20a calculates the error (difference) between the acquired measurement result and the target height (focus position). In step S103, the processor 20a specifies the measurement points 40 in the first shot region where the error calculated in step S102 falls within an allowable range. In step S104, the processor 20a determines the measurement start points (first measurement points) at the second measurement positions in the second shot region so as to omit measurements at the second measurement positions of the measurement points 40 in the second shot region corresponding to the specified measurement points 40 in the first shot region. This allows the processor 20a to determine a movement path (second movement path) for performing step movement of the substrate stage 16 before starting scanning exposure to the second shot region to be shorter than the first movement path. In other words, the processor 20a can determine the movement path (second movement path) related to the step movement of the substrate stage 16 between scanning exposure for the first shot region and that for the second shot region. That is, it is possible to shorten the scanning path 21a of the slit-shaped light when performing step movement of the substrate stage 16. The first movement path is defined as a movement path where the substrate stage 16 has undergone step movement before starting scanning exposure to the first shot region.

In FIG. 4, assume a case in which, for example, the error between the target height and a measurement result obtained by measuring the measurement points $40c_1$ to $40c_3$ in the shot region $15a_1$ serving as the first shot region at the measurement positions $30a_1$ to $30a_3$ (first measurement positions) falls within an allowable range. In this case, the processor 20a determines so as to omit measurements at the measurement positions $30b_1$ to $30b_3$ of the measurement points $40a_1$ to $40a_3$ in the shot region $15a_2$ (second shot region) corresponding to the measurement points $40c_1$ to $40c_3$ in the shot region $15a_1$. That is, the processor 20a determines measurement start points at the measurement positions $30b_1$ to $30b_3$ in the shot region $15a_2$ as the measurement points $40b_1$ to $40b_3$. This allows the processor 20a to determine the movement path for performing step movement of the substrate stage 16 before starting scanning exposure to the shot region $15a_2$ to shorten the focus starting period (the interval between time t3 and time t4). That is, the processor 20a can determine the movement path for performing step movement of the substrate stage 16 to be shorter than that in a case (FIG. 5A) in which the measurement start points at the measurement positions $30b_1$ to $30b_3$ are set to the measurement points $40a_1$ to $40a_3$. FIG. 5B is a view showing the relationship between time and the moving velocity of the substrate stage 16 when starting measurements at the measurement positions $30b_1$ to $30b_3$ from the measurement points $40b_1$ to $40b_3$. In FIG. 5B, black circles (●) indicate the measurement timings at the measurement positions $30a_1$ to $30a_3$ (first measurement positions), and the measurement timings at the measurement positions $30b_1$ to $30b_3$ (second measurement positions), respectively. The movement path of the substrate stage 16 may be determined for each shot region 15a or for each exposure recipe.

The substrate stage 16 undergoes step movement in accordance with thus determined movement path. When the slit-shaped light approaches the shot region $15a_2$ (time t4), scanning exposure to the shot region $15a_2$ starts. At this time, the height of the substrate 15 when performing scanning exposure in the measurement points 40 in the shot region $15a_2$ where measurements at the measurement positions $30b_1$ to $30b_3$ are omitted is controlled based on the measurement results at the measurement positions $30a_1$ to $30a_3$ of the measurement points 40 in the shot region $15a_1$. This makes it possible to control the substrate stage 16 so that the height of the substrate 15 when starting scanning exposure to the shot region $15a_2$ comes close to the target height. In the explanation above, the measurement points 40 in the shot region $15a_2$ where measurements at the measurement positions $30b_1$ to $30b_3$ are omitted include, out of the plurality of measurement points 40 provided in the shot region $15a_2$, the measurement point 40 closest to the end portion of the shot region $15a_2$ where scanning exposure starts. Furthermore, in the first embodiment, the example of only omitting the measurement points $40a_1$ to $40a_3$ in the shot region $15a_2$ has been explained. However, the present invention is not limited to this. Measurements at the measurement positions $30b_1$ to $30b_3$ can be omitted as long as the measurement points 40 are provided within a range from the end portion by the distance Lp. For example, when the measurement points $40b_1$ to $40b_3$ are provided within the range, measurements at the measurement positions $30b_1$ to $30b_3$ can also be omitted in the measurement points $40b_1$ to $40b_3$, in addition to the measurement points $40a_1$ to $40a_3$ in the shot region $15a_2$.

While performing scanning exposure to the shot region $15a_2$, measurements at the measurement positions $30a_1$ to $30a_3$ are performed in the region 21 being irradiated with radiation. Then, based on the measurement results at the measurement positions $30a_1$ to $30a_3$ in the shot region $15a_2$, measurement start points at the measurement positions $30b_1$ to $30b_3$ in the shot region $15a_3$ where scanning exposure will be performed next to the shot region $15a_2$ are determined. Assume a case in which, for example, the error between the target height and the measurement results at the measurement positions $30a_1$ to $30a_3$ of the measurement points $40a_1$ to $40a_3$ in the shot region $15a_2$ falls within the allowable range. In this case, the measurement start points at the measurement positions $30b_1$ to $30b_3$ in the shot region $15a_3$ are determined so as to omit measurements at the measurement positions $30b_1$ to $30b_3$ of the measurement points 40 in the shot region $15a_3$ corresponding to the measurement points $40a_1$ to $40a_3$. On the other hand, assume a case in which the error between the target height and the measurement results at the measurement positions $30a_1$ to $30a_3$ of the measurement points $40a_1$ to $40a_3$ in the shot region $15a_2$ falls outside the allowable range. In this case, the measurement start points at the measurement positions $30b_1$ to $30b_3$ in the shot region $15a_3$ are determined so as to perform measurements at the measurement positions $30b_1$ to $30b_3$ of the measurement points 40 in the shot region $15a_3$ corresponding to the measurement points $40a_1$ to $40a_3$.

As described above, the exposure apparatus 100 of the first embodiment determines the measurement start points at the second measurement positions in the second shot region based on the measurement results at the first measurement positions in the first shot region where scanning exposure has been performed earlier than to the second shot region as the targets of scanning exposure. This allows the exposure apparatus 100 to determine the movement path on which the substrate stage has undergone step movement before starting scanning exposure to the first shot region to shorten the focus starting period. Thus, it is possible to increase the throughput.

Figure 8:
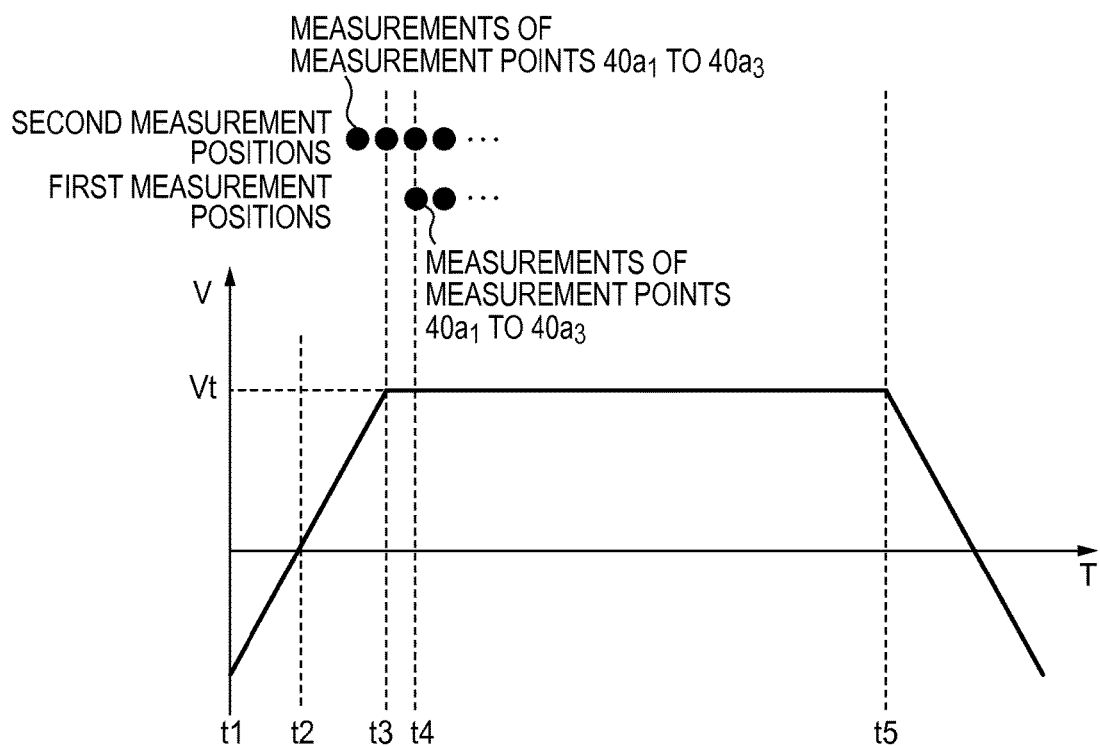
FIG. 8 is a view showing the relationship between the time and the moving velocity of the substrate stage.

In the first embodiment, the example of moving the substrate stage 16 at the uniform velocity when measuring the measurement points in the shot region 15a at the measurement positions $30b_1$ to $30b_3$ has been explained. However, the present invention is not limited to this. For example, as shown in FIG. 8, the measurement points $40a_1$ to $40a_3$ in the shot region $15a_2$ where it has been determined so as to omit measurements at the measurement positions $30b_1$ to $30b_3$ may be measured, instead of omitting measurements at the measurement positions $30b_1$ to $30b_3$ while accelerating the substrate stage 16. FIG. 8 is a view showing the relationship between time and the moving velocity of the substrate stage 16 when performing measurements at the measurement positions $30b_1$ to $30b_3$ of the measurement points $40a_1$ to $40a_3$ while accelerating the substrate stage 16. When applying the present invention to this case, the exposure apparatus 100 may be measure, in advance, the deformations of the substrate stage 16, the measuring unit 17, and the like that may occur during acceleration of the substrate stage 16, and correct the measurement results at the first measurement positions and the second measurement positions to reduce influences caused by these deformations.

Also, in the first embodiment, only the measurement results at the first measurement positions in the first shot region where scanning exposure had been performed earlier than to the second shot region has been used when determining the measurement start points at the second measurement positions in the second shot region. However, the present invention is not limited to this. For example, the measurement results (for example, their average value) at the first measurement positions in the plurality of shot regions where scanning exposure has been performed earlier than to the second shot region may be used. Furthermore, in the first embodiment, the measurement results at the first measurement positions in the first shot region accompanying scanning exposure to the first shot region has been used when determining the measurement start points at the second measurement positions in the second shot region. However, the present invention is not limited to this. Instead of the measurement results, for example, other measurement results at the first measurement positions obtained when performing control corresponding to the control of the height of the substrate in scanning exposure to the second shot region without exposure but with scanning in the shot region may be used. That is, the measurement start points at the second positions in the second shot region may be determined from a result obtained by performing the focus control in the second shot region at the first measurement positions without exposure.

Second Embodiment

Figure 9:
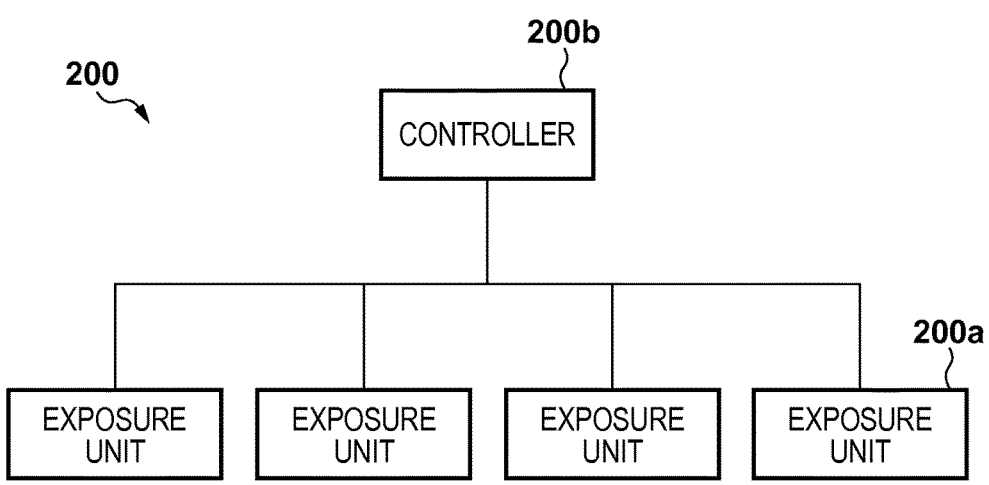
FIG. 9 is a schematic view showing the arrangement of an exposure apparatus according to the second embodiment.

An exposure apparatus 200 of the second embodiment of the present invention will be explained. The exposure apparatus of the second embodiment can include, as shown in FIG. 9, a plurality of exposure units 200a each of which exposes a substrate 15, and a controller 200b (for example, a host computer) which controls each exposure unit 200a. The controller 200b has a role of managing the operation state of each exposure unit 200a and a parameter such as an offset, and determines measurement start points and timings at second measurement positions in each shot region 15a on the substrate 15 where exposure is performed in each exposure unit 200a.

<Embodiment of Method of Manufacturing Article>

A method of manufacturing an article according to an embodiment of the present invention is suitable for manufacturing a microdevice such as a semiconductor device, and an article such as an element having a microstructure. The method of manufacturing the article according to the embodiment includes a step of forming a latent image pattern on a photosensitive agent applied to a substrate by using the aforementioned exposure apparatus (step of exposing a substrate), and a step of developing the substrate on which the latent image pattern has been formed in the preceding step. Further, the manufacturing method includes other well-known steps (for example, oxidization, deposition, vapor deposition, doping, planarization, etching, resist removal, dicing, bonding, and packaging). The method of manufacturing the article according to the embodiment is superior to a conventional method in at least one of the performance, the quality, the productivity, and the production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-019768 filed on Feb. 4, 2014, which is hereby incorporated by reference herein in its entirety.

What is claimed is:

1. An exposure apparatus which performs a scanning exposure of each of a plurality of shot regions on a substrate to radiation, the apparatus comprising:
    a measuring device including a first detector configured to perform detection with respect to a measurement point on the substrate in a region being exposed to radiation while scanning of the substrate is performed, and a second detector configured to perform detection with respect to the measurement point prior to detection by the first detector while scanning of the substrate is performed, and configured to respectively measure heights of the substrate based on an output from the first detector and an output from the second detector; and
    a processor configured to determine, based on whether an error falls within an allowable range, the error being an error between a target height and a measured height obtained by the measuring device based on an output from the first detector while a scanning exposure of a first shot region on the substrate to radiation is performed, a first measurement point where the measuring device performs measurement first based on an output from the second detector with respect to a second shot region different from the first shot region.

2. The apparatus according to claim 1, further comprising a stage configured to hold the substrate and be movable,
    wherein the processor is configured to determine, based on the determined first measurement point, a path of step movement of the stage between a scanning exposure of the first shot region and a scanning exposure of the second shot region.

3. The apparatus according to claim 2, wherein the processor is configured to change the path so as to change a section on the path in which the stage is caused to be moved at a constant velocity.

4. The apparatus according to claim 1, wherein the processor is configured to control, with respect to the second shot region, height of the substrate based on the measured height before measurement is performed with respect to the first measurement point by the measuring device.

5. The apparatus according to claim 1, wherein the processor is configured to determine, of a plurality of measurement points preset with respect to the second shot region, the first measurement point.

6. The apparatus according to claim 1, wherein a substrate on which the first shot region is formed and a substrate on which the second shot region is formed are the same.

7. The apparatus according to claim 1, wherein a substrate on which the first shot region is formed and a substrate on which the second shot region is formed are different from each other.

8. The apparatus according to claim 1, wherein the processor is configured to determine the first measurement point with respect to each shot region on the substrate.

9. The apparatus according to claim 1, wherein the processor is configured to apply the first measurement point determined with respect to the second shot region to another shot region on the substrate.

10. The apparatus according to claim 1, wherein the processor is configured to determine the first measurement point with respect to a shot region on a substrate of which a scanning exposure is performed, based on, instead of the measured height, a measured height obtained by the measuring device based on an output from the first detector in a case where control corresponding to control of height of a substrate with a scanning exposure thereof has been performed without an exposure but with scanning thereof.

11. The apparatus according to claim 1, wherein the scanning exposure is performed with a charged particle beam.

12. A method of manufacturing an article, the method comprising:
    exposing a substrate using an exposure apparatus;
    developing the exposed substrate; and
    processing the developed substrate to manufacture the article,
    wherein the exposure apparatus performs a scanning exposure of each of a plurality of shot regions on the substrate to radiation, and includes:
    a measuring device including a first detector configured to perform detection with respect to a measurement point on the substrate in a region being exposed to radiation while scanning of the substrate is performed, and a second detector configured to perform detection with respect to the measurement point prior to detection by the first detector while scanning of the substrate is performed, and configured to respectively measure heights of the substrate based on an output from the first detector and an output from the second detector; and
    a processor configured to determine, based on whether an error falls within an allowable range, the error being an error between a target height and a measured height obtained by the measuring device based on an output from the first detector while a scanning exposure of a first shot region on the substrate to radiation is performed, a first measurement point where the measuring device performs measurement first based on an output from the second detector with respect to a second shot region different from the first shot region.

13. An exposure apparatus which performs a scanning exposure of each of a plurality of shot regions on a substrate to radiation, the apparatus comprising:
a measuring device configured to perform first detection with respect to a measurement point on the substrate in a region being exposed to radiation while scanning of the substrate is performed, and a second detection with respect to the measurement point prior to the first detection while scanning of the substrate is performed, and configured to respectively measure heights of the substrate based on the first detection and the second detection; and
a processor configured to change, based on whether an error falls within an allowable range, the error being an error between a target height and a measured height obtained by the measuring device based on the first detection while a scanning exposure of a first shot region on the substrate to radiation is performed, a first measurement point where the measuring device performs measurement first based on the second detection with respect to a second shot region different from the first shot region, from a point predetermined as the first measurement point.

14. A method of manufacturing an article, the method comprising:
exposing a substrate using an exposure apparatus defined in claim 13;
developing the exposed substrate; and
processing the developed substrate to manufacture the article.

15. The apparatus according to claim 13, wherein the controller is configured to specify a measurement point in the first shot region where the error falls within the allowable range, and determine the first measurement point by omitting a measurement point predetermined in the second shot region corresponding to the specified measurement point.

16. The apparatus according to claim 15, wherein a distance between an end portion of the second shot region where a scanning exposure starts and the omitted measurement point in the second shot region is shorter than a moving distance of the substrate between the second detection and the first detection.

17. The apparatus according to claim 16, wherein the omitted measurement point includes a measurement point closest to the end portion, of a plurality of measurement points predetermined in the second shot region.

* * * * *